(12) United States Patent
Goren et al.

(10) Patent No.: US 7,080,340 B2
(45) Date of Patent: Jul. 18, 2006

(54) INTERCONNECT-AWARE INTEGRATED CIRCUIT DESIGN

(75) Inventors: David Goren, Nesher (IL); Rachel Gordin, Hadera (IL); Michael Zelikson, Haifa (IL)

(73) Assignee: International Business Machines Corporation, Armonk, NY (US)

( * ) Notice: Subject to any disclaimer, the term of this patent is extended or adjusted under 35 U.S.C. 154(b) by 112 days.

(21) Appl. No.: 10/723,752

(22) Filed: Nov. 26, 2003

(65) Prior Publication Data

US 2005/0114819 A1    May 26, 2005

(51) Int. Cl.
G06F 17/50 (2006.01)
(52) U.S. Cl. ............... 716/12; 176/11; 176/5; 176/6
(58) Field of Classification Search .............. 716/1–18; 703/13–20
See application file for complete search history.

(56) References Cited

U.S. PATENT DOCUMENTS

| | | | | |
|---|---|---|---|---|
| 5,896,300 | A * | 4/1999 | Raghavan et al. | 716/10 |
| 5,901,063 | A * | 5/1999 | Chang et al. | 716/4 |
| 6,342,823 | B1 * | 1/2002 | Dansky et al. | 333/1 |
| 6,374,391 | B1 * | 4/2002 | Yamada | 716/5 |
| 6,381,730 | B1 * | 4/2002 | Chang et al. | 716/5 |
| 2002/0104063 | A1 * | 8/2002 | Chang et al. | 716/4 |
| 2003/0172358 | A1 * | 9/2003 | Alon et al. | 716/1 |
| 2004/0111688 | A1 * | 6/2004 | Lee et al. | 716/12 |

OTHER PUBLICATIONS

Goren, D., et al., "On-chip Interconnect-Aware Design and Modeling Methodology, Based on High Bandwidth Transmission Line Devices", DAC 2003, Jun. 2-6, 2003, Anaheim, CA, USA, Copyright 2003 ACM 1-58113-688-9/03/0006.

* cited by examiner

*Primary Examiner*—Vuthe Siek
*Assistant Examiner*—Nghia M. Doan
(74) *Attorney, Agent, or Firm*—Stephen C. Kaufman

(57) ABSTRACT

In a system 10 for designing an integrated circuit, a preliminary design of the integrated circuit is defined and critical interconnect lines in the preliminary design are identified. Further, any critical interconnect lines which are affected by crossing lines in the preliminary design are identified, and a transmission line model 35 is defined to represent each critical interconnect line. A layout design of the integrated circuit, comprising circuit components and parameters thereof, is then defined using the preliminary design and the transmission line model 35 for each critical interconnect line. Component parameters are then extracted from the layout design for simulation of the design using the extracted component parameters. During this design process, for each transmission line model 35 representing a critical interconnect line affected by a crossing line, an environment terminal 36 is provided. The environment terminal 36 comprises a connection to the model 35 via at least one circuit component representing the effect of the crossing line on the model. The environment terminal 36 is connected to the appropriate crossing line in the integrated circuit design, whereby crossing line effects are accommodated in the design process.

21 Claims, 4 Drawing Sheets

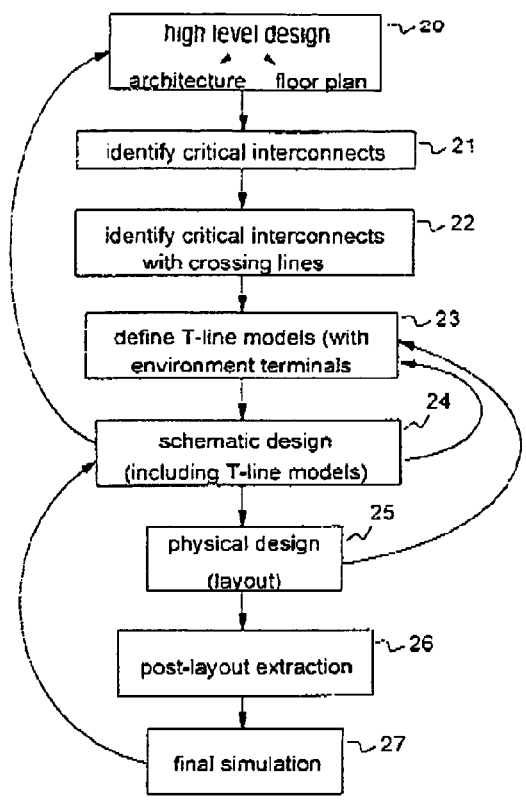
Figure 3
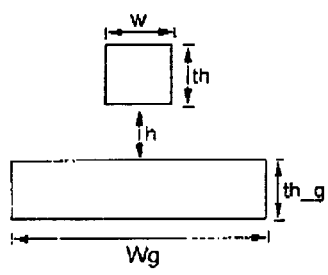
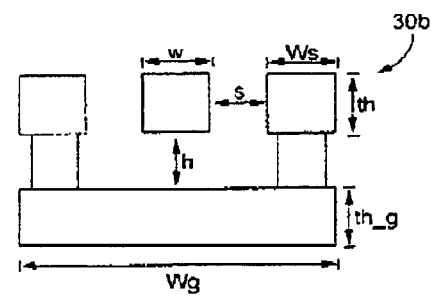
Figure 4a                    Figure 4b

INTERCONNECT-AWARE INTEGRATED CIRCUIT DESIGN

TECHNICAL FIELD

This invention relates generally to the design of integrated circuits (ICs), and more particularly to IC design methodologies which account for the effect of on-chip interconnect lines in the design process.

BACKGROUND OF THE INVENTION

Improvements in IC technology are leading to continued increases in IC operating speeds. For example, the recently introduced SiGe BiCMOS technology offers a tremendous increase in on-chip signal bandwidth in the areas of analog and mixed signal (AMS) design, providing operating speeds in the region of tens of Gigahertz. As operating speeds reach the multi-Gigahertz range, on-chip interconnect lines, i.e. wires connecting circuit components, can have a major impact on IC performance. High speed design is characterized by a frequent need for true-transient time-domain simulations, high importance of signal integrity, and characteristic bandwidths in the microwave region. Thus a consideration of on-chip interconnect line ("interconnect") effects becomes necessary. Moreover, early incorporation of interconnects in the design process is highly desirable because a traditional post-layout treatment of on-chip interconnects can lead to numerous design iterations or a significant amount of over-design. To address these issues, our copending U.S. Pat. application Ser. No. 10/091,934, filed 6 Mar. 2002, discloses an interconnect-aware IC design methodology in which interconnects can be modeled as transmission lines ("T-lines") and incorporated in the design at an early stage of the design process. This system is also discussed in "An Interconnect-Aware Methodology for Analog and Mixed Signal Design, Based on High Bandwidth (Over 40 GHz) On-Chip Transmission Line Approach", D. Goren et al., IEEE DATE'02 conference, Paris, Mar. 4–8 2002. The system is explained briefly below with reference to FIG. 1 of the accompanying drawings.

The flow chart of FIG. 1 illustrates the basic steps in an exemplary design process embodying the aforementioned methodology. As with conventional IC design processes, the overall process is typically implemented via a CAD (Computer-Aided Design) system under control of a designer who provides the inputs required during the design process, the CAD system incorporating software tools for performing various processing steps and assisting the designer with the various design stages. As will be apparent to those skilled in the art, the basic steps of the FIG. 1 process correspond broadly to those of a conventional IC design flow while differing in key respects explained in the following.

Step 1 of the FIG. 1 flow represents the initial stage of defining a high level design of the IC. This typically includes the usual architecture and floor plan definitions, whereby major design blocks are defined and their locations broadly determined. Thus, the overall design project is defined on a system level in this stage. However, in contrast to conventional design flows, certain interconnects in the high level design are selected in this early design phase for modeling as T-lines. These are the "critical interconnects", and identification of these interconnects is represented by step 2 of the FIG. 1 flow. Particular criteria for identifying critical interconnects will be discussed below. Suffice to say here that the critical interconnects are usually only a small subset of the totality of interconnects in a given design. Step 2 also involves defining the T-line models to represent the critical interconnects. For each critical interconnect, a T-line structure is defined by selecting a desired structure from a predefined set of structures. A basic feature of these structures is that most of the electric field lines and the current return path are contained within the structure boundary. Examples of T-line structures which can be included in this set are detailed in the above-referenced documents and will be described further below. Briefly, however, these predefined structures represent respective, generic arrangements of signal wires and shielding, with variable geometrical parameters (height, width, separation, etc.) for the various elements of the structure. The required geometrical parameters for the T-line structure selected for a given interconnect are defined in response to input by the designer. A corresponding T-line model is then defined via an embedded algorithm implemented by a T-line modeling component of the system. The T-line models used here are based on RLC (resistance-inductance-capacitance) ladder networks, with the particular network structure and RLC component values being determined by the modeling algorithm.

Once the critical interconnect lines have been identified and their equivalent T-line models defined, these are treated in the same way as other components in the subsequent design process. In particular, in step 3 of the design flow a schematic design of the IC is defined. Here, circuit components such as transistors, resistors, connecting wires, etc. may be defined in the usual way, with the connecting wires generally being defined as ideal wires at this stage. However, the T-line models for critical interconnects are also included in the schematic design, with possible refinement of their underlying geometrical parameters and hence component values. Thus, all on-chip T-lines are automatically net-listed and simulated together with other circuit components, and are treated equally throughout the design process. Further lines may also be identified as critical interconnects at this stage. Thus, the design flow may refer back from step 3 to steps 1 and 2 as indicated by the arrow in the figure, to account for such refinements of the preliminary high level design.

Next, in step 4 of the design process a physical (layout) design is defined based on the schematic design. In this step, the physical location and layout of circuit elements and wires on the IC are defined, along with the various component parameters. The T-line models are passed into the layout design as parameterized cells (p-cells) whereby each model forms an identifiable, unitary component of the design. The p-cells are correct by construction both from the DRC (Design Rule Checking) and LVS (Layout Versus Schematic) points of view. Here, the actual lengths of T-lines may differ slightly from their schematic level values, so that some stretching and bending may be required with consequent adjustment of T-line parameters. Thus, back-annotation from the layout design to the schematic design step may be performed to account for such adjustments.

The next stage of the design flow is the post-layout extraction step 5. Here, a software extraction tool of the design system extracts component parameters from the layout design for simulation purposes in the usual way. Wires modeled as T-lines are recognized here and treated as any other library elements, namely their geometrical parameters are extracted and transferred into the same model equations for post-layout simulation. Wires not modeled as T-lines undergo the standard extraction procedure of conventional systems, whereby an automatic approximate calculation is performed by the extraction tool for wire non-ideal properties. This is faster but less accurate than the special treatment applied to critical interconnects. The complete netlist, combining both the T-line models and the other layout-extracted components, is then simulated in step 6 of the design flow, the simulated results being compared to the original design requirements to complete a bottom-up verification of the design process. If discrepancies are found, the design process may revert to step 4 as indicated in the figure for appropriate modification of the design. However, correct choice of critical interconnects in the earlier design steps makes a one-iteration success highly likely.

As already mentioned, the T-line structures from which the T-line models are derived in the above system are based on the "closed environment concept", whereby the majority of electric field lines are closed within the structure cross-section and the structure contains its own current return path, i.e. the sum of the currents in its cross-section is zero. This concept is valid for design areas such as AMS design which are characterized by relatively sparse layout (and few crossing lines) in all metal layers. In other design areas such as CMOS design, where design is dense and Manhattan layout is used, the closed environment concept becomes inapplicable where critical interconnects are affected by crossing lines, i.e. lines which cross critical interconnects in a higher or lower layer of the IC structure. For example, where a critical interconnect runs beneath or above a perpendicular line such as a bus, the effect on T-line behavior can be considerable. Consider for example a crossing line in the form of a 64-bit bus consisting of a group of 2 μm wires separated by 1 μm, such that the bus width reaches 190 μm, interference caused by the bus can clearly have a significant effect on T-line behavior. Accordingly, an IC design methodology which can accommodate such crossing line effects would be highly desirable.

SUMMARY OF THE INVENTION

According to the present invention there is provided a method for designing an integrated circuit, the method comprising the steps of:

defining a preliminary design of the integrated circuit;

identifying critical interconnect lines in the preliminary design;

identifying any critical interconnect lines affected by crossing lines in the preliminary design;

defining a transmission line model to represent each critical interconnect line;

defining a layout design of the integrated circuit, comprising circuit components and parameters thereof, using said preliminary design and said transmission line model for each critical interconnect line; and extracting component parameters from the layout design for simulation of the design using the extracted component parameters;

wherein for each transmission line model representing a critical interconnect line affected by a crossing line, the method includes providing an environment terminal, comprising a connection to the model via at least one circuit component representing the effect of the crossing line on the model, and connecting the environment terminal to the crossing line in the integrated circuit design.

Thus, embodiments of the present invention provide IC design methods based on the methodology of our earlier system discussed above, but in which the effect of crossing lines on critical interconnects can be accommodated in the design process. Critical interconnects are identified and modeled as T-lines as before, but those critical interconnects which are affected by crossing lines are identified as part of the design process. For each critical interconnect affected by a crossing line, an "environment terminal" is provided. This environment terminal comprises a connection to the corresponding T-line model via at least one circuit component, in preferred embodiments a capacitor, which represents the effect of the crossing line. The environment terminal is connected to the relevant crossing line in the design, whereby the effect of the crossing line is accommodated in design simulations. An elegantly simple and highly effective mechanism is therefore provided for accounting for crossing line effects in the design process, allowing extension of the advantageous methodology of our earlier system to a wider range of IC design areas.

In preferred embodiments of the invention, the design flow is based closely on that of our earlier system as described above with reference to FIG. 1. For example, the preliminary design preferably comprises a high level design of the IC as described above. (The preliminary design may, however, take other forms and particular examples will be discussed below). Further, the step of defining a layout design preferably comprises: defining a schematic design of the integrated circuit, comprising a preliminary set of circuit components and parameters thereof, using the high level design and said transmission line model for each critical interconnect line; and defining the layout design, comprising a secondary set of circuit components and parameters thereof and indicating component locations, using said schematic design. Here, the preliminary and secondary component/parameter sets may be the same or different, depending on whether any adjustments are made at the layout stage as discussed above. In addition, the step of defining a transmission line model preferably comprises: defining a transmission line structure, for example by selecting the structure from a predefined set of transmission line structures as discussed above; defining geometrical parameters for the transmission line structure; and defining the transmission line model in dependence on said structure and geometrical parameters, where the transmission line model preferably comprises an RLC network.

In general, one or more interconnect lines may be identified as critical in a given design, and while embodiments might be envisaged where all interconnect lines are treated as critical interconnects to be modeled as T-lines, typically only a small subset of the totality of interconnect lines will be deemed critical in a given design. In general, an interconnect line which is modeled as a T-line in embodiments of the invention may be a connecting line or a section of a connecting line between circuit components in the design. In particular, a given line in the IC design may be notionally divided into segments, with different segments represented by respective T-line models in some cases. In any case, of the critical interconnects identified in a given design, one or more of these may be identified as subject to a crossing line effect. Particular ways in which the affected interconnects might be identified will be discussed below. At least some of the affected interconnects will typically be identified when the preliminary design is initially drawn up. Thus, for at least a subset of the critical interconnects affected by crossing lines (e.g. the one or more affected interconnects identified at this initial stage), the step of defining a T-line model for each such interconnect may include providing an environment terminal for that T-line model. The T-line modeling component could therefore include (or have the facility to include) an environment terminal in any T-line models defined for critical interconnects, the environment terminal then being connected to a crossing line in the design (and so affecting behavior of the model) only where appropriate.

Thus, where an affected critical interconnect is identified in a preliminary high level design for example, the environment terminal added to the basic T-line model by the modeling component can be connected to the crossing line in question in the high level design. Alternatively, or in addition, environment terminals may be provided and/or connected to crossing lines at a later stage of the design process. For example, if a critical interconnect affected by a crossing line is identified at a later design stage such as the schematic, layout or extraction stages, then an environment terminal could be added at that stage to the T-line model for the interconnect in question. Thus, for at least a subset of critical interconnects affected by crossing lines, the step of defining a layout design (which typically includes an initial step of defining a schematic design) may include providing an environment terminal for the T-line model for each such interconnect, the environment terminal then being connected to the appropriate crossing line in the design. Similarly, for at least a subset of critical interconnects affected by crossing lines, the post layout extraction step may include providing an environment terminal, connected to the appropriate crossing line in the design, for the T-line model for each such interconnect. In general therefore, environment terminals may be provided at various stages of the design process, and preferred embodiments allow for inclusion of environment terminals at each key design stage as designs are developed and refined.

The invention also provides an integrated circuit design system comprising:

means for defining a preliminary design of an integrated circuit;

means for defining transmission line models to represent respective critical interconnect lines in the preliminary design;

means for defining a layout design of the integrated circuit, comprising circuit components and parameters thereof, based on said preliminary design and said transmission line model for each critical interconnect line;

post-layout extraction means for extracting component parameters from the layout design for simulation of the design using the extracted component parameters; and means for including in the integrated circuit design, for each transmission line model representing a critical interconnect line affected by a crossing line in the design, an environment terminal connected to said crossing line, the environment terminal comprising a connection to said model via at least one circuit component representing the effect of said crossing line on the model.

In general, where features are described herein with reference to a method embodying the invention, corresponding features may be provided in a system embodying the invention, and vice versa.

A further aspect of the invention provides a computer program product comprising a computer-readable medium having embodied therein computer-readable program code means for causing a computer to implement an integrated circuit design system as described above.

Another aspect of the invention provides a computer program product comprising a computer-readable medium having embodied therein computer-readable program code means for causing a computer to implement an interconnect modeling component of an integrated circuit design system, the interconnect modeling component being adapted for:

defining transmission line models to represent respective critical interconnect lines in an integrated circuit design; and providing, for a said transmission line model representing a critical interconnect line affected by a crossing line in the integrated circuit design, an environment terminal comprising a connection to the model via at least one circuit component representing the effect of said crossing line on the model.

An additional aspect of the invention provides a computer program product comprising a computer-readable medium having embodied therein computer-readable program code means for causing a computer to implement a post-layout extraction component of an integrated circuit design system in which critical interconnect lines in an integrated circuit design are represented by respective transmission line models. The post-layout extraction component is adapted for processing a layout design of the integrated circuit, which layout design comprises circuit components, including said transmission line models, and parameters thereof, by:

including in the layout design, for a transmission line model representing a critical interconnect line affected by a crossing line in the design, an environment terminal connected to said crossing line, the environment terminal comprising a connection to said model via at least one circuit component representing the effect of said crossing line on the model; and extracting component parameters from the layout design for simulation of the design using the extracted component parameters.

The invention also extends to integrated circuit design kits including such computer program products.

BRIEF DESCRIPTION OF THE DRAWINGS

Preferred embodiments of the invention will now be described, by way of illustrative and non-limiting example, with reference to the accompanying drawings in which:

FIG. 3 is a flow chart illustrating an interconnect-aware IC design process embodying the invention;

FIGS. 4a through 4f illustrate T-line structures which may be used in the design process of FIG. 3 (FIGS. 4a through 4d showing exemplary microstrip structures, which have bottom shielding and optional side shielding, and FIGS. 4e and 4f showing exemplary coplanar (CPW) structures which have only side shielding);

DESCRIPTION OF PREFERRED EMBODIMENTS

Figure 1:
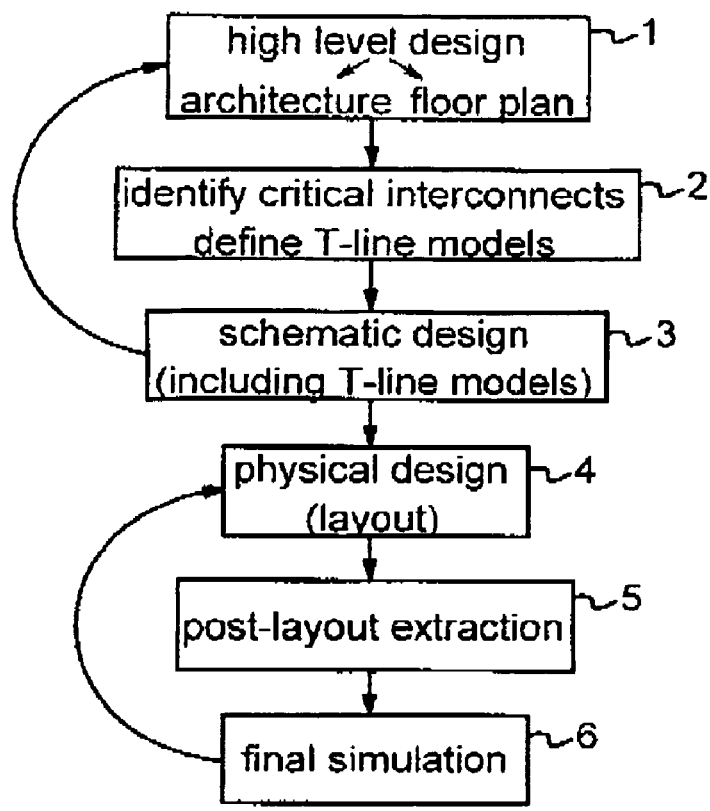
FIG. 1 is a flow chart illustrating a prior interconnect-aware IC design process.
Figure 2:
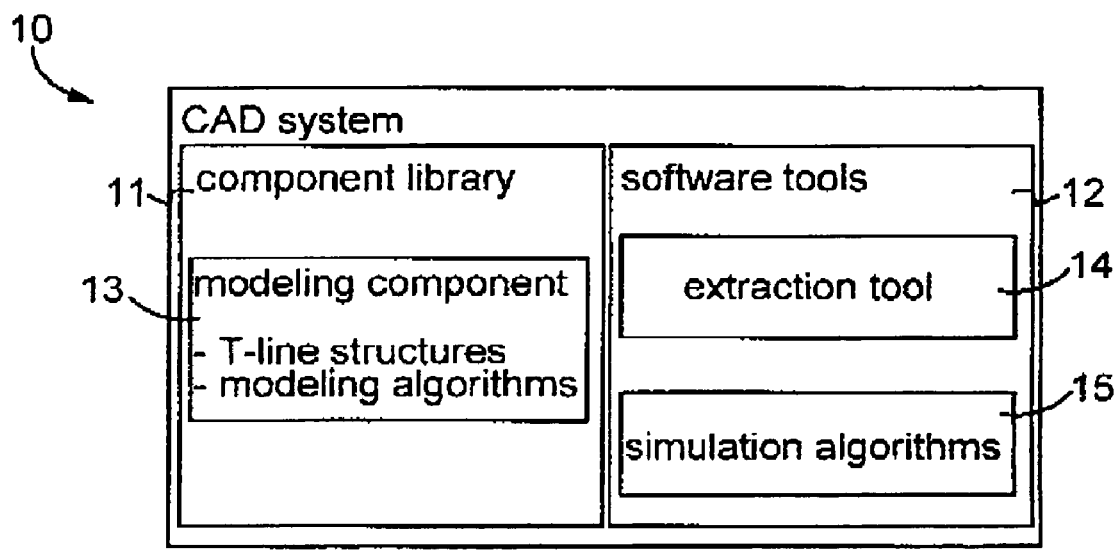
FIG. 2 is a schematic representation of an IC design system for implementing a design process embodying the invention.
Figure 4C:
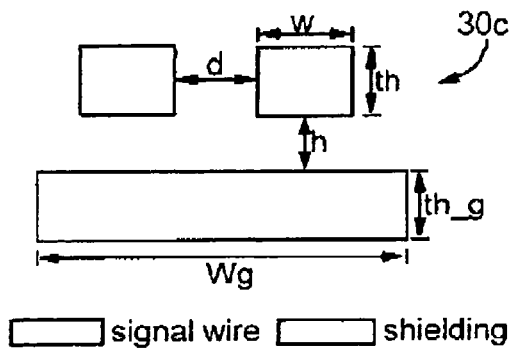
Figure 4D:
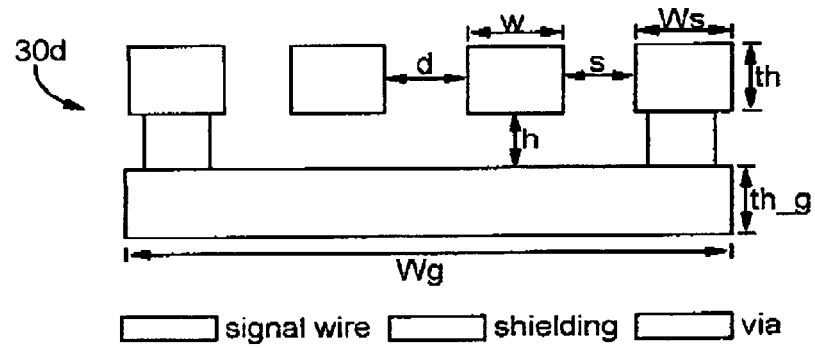
Figure 4E:
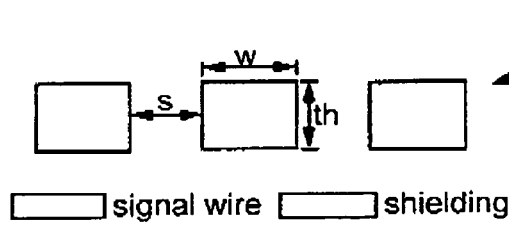
Figure 4F:
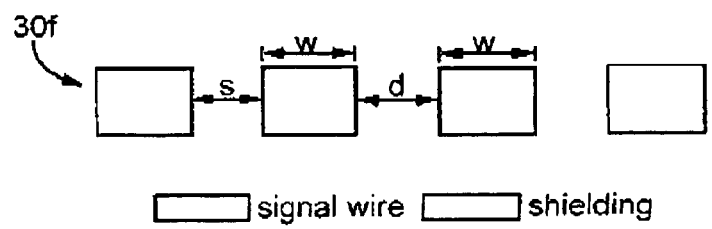

FIG. 2 is a schematic illustration of an IC design system embodying the invention showing the main components involved in operation of the design process. The system 10 here is implemented by specialized CAD software running on a computer providing an interface with a designer who controls the overall design process by appropriate inputs to the system. The main software components of the CAD system are represented generally in the figure by component library 11 and software tools 12. In component library 11, the basic circuit components such as transistors, resistors etc., which may be incorporated in IC designs are defined for selection by the designer when required. The component library also includes a T-line modeling component 13 for defining T-line models as additional library elements. In this embodiment, the T-line modeling component comprises a set of predefined T-line structures with embedded modeling algorithms for generating T-line models based on selected parameter values for the T-line structures as discussed further below. Software tools 12 comprise the basic design tools for interfacing with the designer and implementing various processing operations required during the design process. These include a post-layout extraction tool 14 the operation of which will be described below, and simulation algorithms 15 for simulating designs generated by the system.

The system 10 may provide a generalized design environment for a variety of IC technology areas, or may be specialized for a particular design technology. In addition, various components of the system may be supplied separately. Component library 11, for example, may be provided in an IC design kit, either as a generalized library for a range of IC technology areas or, more typically, as a specialized library for a particular design technology. The library can then be loaded in a basic IC design system to adapt the system to the specialized technology. Similarly, software tools may be provided separately for loading in a basic design system. In particular, the extraction tool 15 of the present embodiment, which is adapted to accommodate environment terminals as discussed below, may be provided as an independent software component.

FIG. 3 illustrates the basic steps of an IC design flow embodying the present invention which can be implemented by design system 10. Step 20 in FIG. 3 represents the initial step of defining a preliminary design of the IC, here a high level design including the basic architecture and floor plan definitions whereby the main design blocks are defined and broadly located. In this stage, the various levels of the multi-level IC structure can be addressed in turn. For example, the upper hierarchy level signals and buses may be defined and their coarse routing established, the next level down then being similarly explored, and so on until the lowest hierarchy level is reached. Also in this step, a preliminary power grid design may be defined and metal layers for power lines allocated. At this point, the critical interconnects in each hierarchy level which are to be modeled as T-lines can be identified as indicated by step 21 in the figure. Various criteria may be applied here to distinguish critical from non-critical interconnects, for example criteria relating to the estimated length and metal level assignment of the interconnects. The selection of critical interconnects may also depend on the switching signal/clock speed (risetime) for high speed digital/mixed signal applications, or on the signal bandwidth for analog applications, and also on the signal integrity and timing requirements from a given line which are highly dependent on the specific application. Thus, suitable criteria may be specified as desired for a given application. Typically, however, the critical lines will be the longer high speed lines in a given design, and the number of critical lines will usually be much lower than the total number of lines in the design. Whatever the particular criteria applied in a given system, selection of the critical interconnects may be at the designer's discretion, whereby these interconnects are identified in the system in response to selection input by the designer. Alternatively, critical interconnects could be wholly or partly identified by a software tool of the system which applies predetermined criteria to automatically identify critical interconnects. (Such automatic identification might also be employed in subsequent design stages discussed below, even in the post-layout stage, to verify a designer's earlier manual selection of critical interconnects).

Step 22 of the FIG. 3 flow represents the step of identifying those critical interconnects which are affected by crossing lines in the high level design. Again, various criteria may be applied here to determine relevant crossing lines and whether a given interconnect is affected by such a crossing line. By way of example, only certain types of crossing lines might be considered relevant here. For example, only lines comprising groups of wires, such as buses and power grids, may be considered in some cases, or only buses/power grids above a specified width. Another possible constraint might relate to the physical distance between T-lines and crossing lines. As another example, crossing lines which are below the microstrip T-line structures (discussed below with reference to FIGS. 4*a* through 4*d*) are generally not considered. Again, the identification of affected critical interconnects could be fully or partly automatic, whereby the identification process is performed or assisted by a software tool based on predefined criteria. Alternatively, or in addition, the identification process may be manually controlled, whereby the affected critical interconnects are identified in the system in response to input by the designer. In any case, while step 22 is represented in FIG. 3 as a distinct step following step 21 of the design flow, it will be appreciated that this step may be performed in conjunction with step 21 while assessing the interconnects in the design.

Once the critical interconnects, including those affected by crossing lines, have been identified, a T-line model is defined for each of the critical interconnects as indicated by step 23 in FIG. 3. For each critical interconnect, a T-line structure is first defined. In this embodiment, the T-line structure for an interconnect is defined by selecting a desired structure from a predefined set of parameterized structures in modeling component 13 of component library 11. An example of a set of structures which might be employed here is shown in FIGS. 4*a* through 4*f*. The structures 30*a* through 30*f* illustrated in these figures correspond to those described in the references given above for our earlier interconnect-aware design system. Each figure shows a cross-section of the basic geometry of the structure (see the upper component marked in sideways lines in FIG. 4*a*), defining the arrangement of signal wires, shielding and (in FIGS. 4*b* and 4*d*) vias, with general parameters corresponding to dimensions such as width, thickness, height and separation of the various elements. These dimensions are represented by parameters w, th, h, $_{13}$ g, Wg, Ws, s and d in the set of structures as illustrated in the figures. A basic characteristic of these structures is that they conform to the closed environment condition discussed earlier, whereby most of the electric field lines and the current return path are contained within the structure boundary. In the examples shown, structures 30*a* through 30*d* are microstrip structures, and structures 30*e* and 30*f* are coplanar (CPW) structures. Of the microstrip structures, structures 30*a* and 30*b* are single-wire T-line structures, and structures 30*c* and 30*d* are two-coupled-wire structures particularly suitable for differential designs. The microstrip structures 30*a* through 30*d* here include a bottom shielding layer to inhibit coupling to the conductive silicon substrate (not shown), and thus inhibit substrate cross-talk, while also reducing inductance of the structure and thus reducing inductance-related signal integrity problems such as overshoots, ringing and damped resonances in longer wires. Structures 30*b* and 30*d* also include side shielding of the signal line, with optional stacked vias being included here between the side and bottom shielding ensuring equal potential on the bottom and side shields, since the via to via separation is designed to be smaller than the shortest possible on-chip wavelength. The coplanar structures 30e (single-wire) and 30f (two-coupled-wire) have only side shielding. This offers extra design flexibility and may be particularly useful for CMOS high-density designs where the use of bottom shielding may present design difficulties.

While FIGS. 4a through 4f show particular examples of T-line structures employed in this preferred embodiment, different structures may be employed in other embodiments. For example, other shielding arrangements such as top shielding only, bottom and top shielding, or no shielding might be employed. As an example, two coupled lines carrying a differential signal could serve as the return paths for each other without requiring additional shielding. In general, all possible metal layer combinations supported by a given technology could be used for signal and shielding, with structures which comply with the closed environment condition being particularly preferred.

Figure 5:
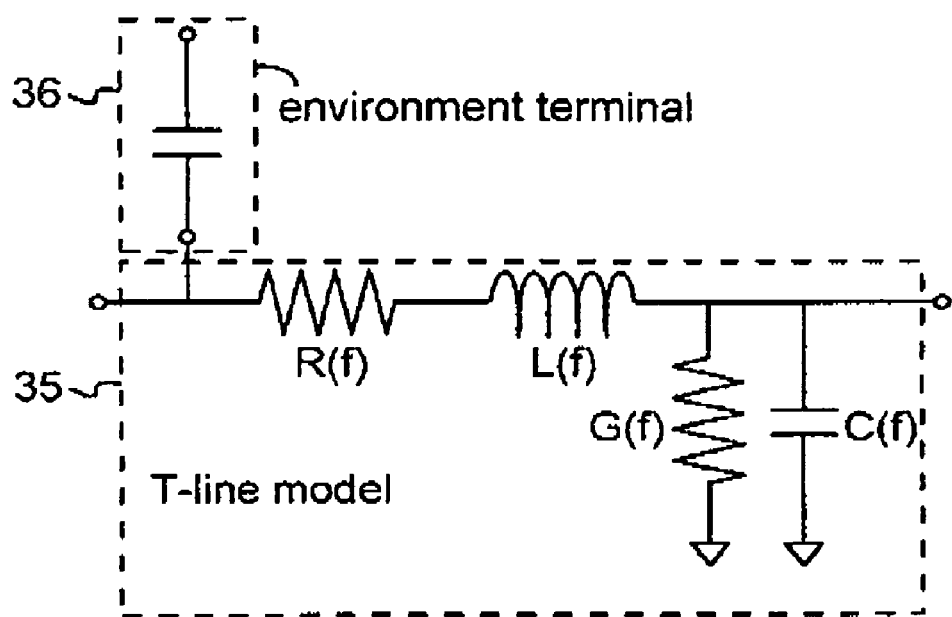
FIG. 5 is a schematic high level representation of a T-line model with an environment terminal for use in the design process of FIG. 3.

Referring back to step 23 of FIG. 3, once a T-line structure has been selected by the designer for a given critical interconnect, the designer then specifies values for the dimension variables (w, th, etc.) of the structure whereby the geometrical parameters of the T-line structure are defined in the system. The embedded modeling algorithm then defines a corresponding T-line model to represent the critical interconnect based on the selected T-line structure and specified geometrical parameters. Various modeling algorithms could be employed here, and the particular algorithm employed is not critical to the present invention. However, in this preferred embodiment, modeling algorithms defining T-line models based on RLC ladder networks are employed as in our earlier design system detailed in the aforementioned references (the relevant content of which is incorporated herein by reference). Thus, the modeling algorithm receives the structure selection and geometrical parameters and constructs the equivalent RLC network, comprising one or more (typically several cascaded) RLC segments, with appropriate electrical parameters, i.e. RLC component values, where these values may be expressed as frequency-dependent functions). In addition, for each critical interconnect subject to a crossing line effect as discussed above, the modeling component adds an environment terminal to the T-line model for the interconnect. This environment terminal provides a connection to the model via at least one circuit component representing the effect of the crossing line on the model. An example of a T-line model, with associated environment terminal, is illustrated in FIG. 5. Here the T-line model is indicated generally at 35 and includes frequency-dependent resistances $R(f)$ and $G(f)$, a frequency-dependent inductance $L(f)$ and a frequency-dependent capacitance $C(f)$ as defined by the modeling algorithm. The environment terminal is indicated at 36. In this embodiment, the component of the environment terminal which represents the effect of the crossing line is a capacitor. The value of this capacitance can be determined in various ways. For example, a suitable capacitance value may be input by the designer based on assessment of the interconnect and crossing line in question, and/or a value might be provided automatically by the modeling component or a software tool of the system based on specified criteria relating to the interconnect and crossing line in question. At this early design stage in the present embodiment, it is assumed that the designer estimates a suitable capacitance value to represent the effect of the capacitive load indicated by the crossing line. (The designer may use various electromagnetic tools to assist with this estimate, or he may employ a simple set of "rules of thumb"). However, this value may be modified in subsequent design stages as discussed further below.

Figure 6:
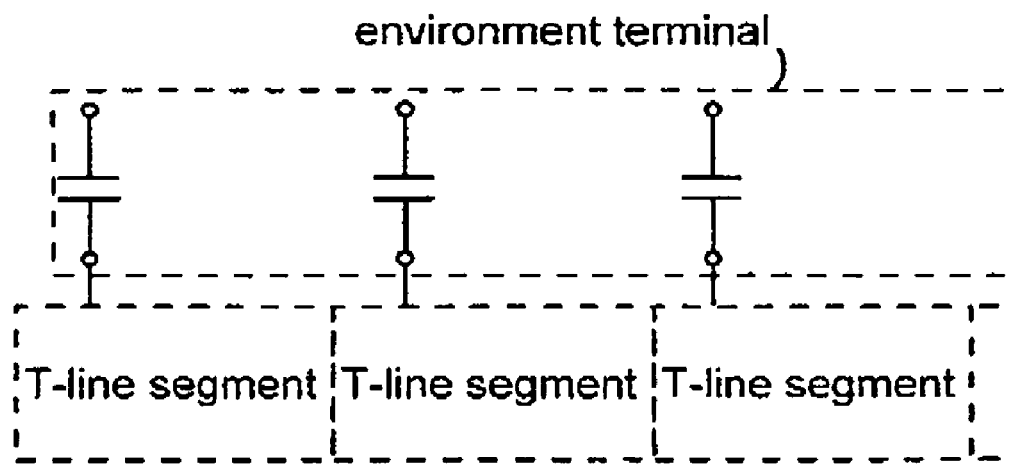
FIG. 6 is a schematic illustration of a multi-segment T-line model and associated environment terminal.

While FIG. 5 shows a simple representation of a T-line model with environment terminal, in practice a given model may comprise several, usually identical, T-line segments as mentioned above. In this case, the environment terminal comprises a parallel connection, where the individual lines of the parallel connection are connected, via respective components (here capacitors), to respective segments of the T-line network. This is illustrated in FIG. 6. Here the individual capacitance values may or may not be identical depending on the crossing lines situation in question, the specific values being determined as described above with reference to FIG. 5.

Returning now to step 23 of FIG. 3, it will be appreciated that, while represented as an independent step in the figure, step 23 could in fact be performed in conjunction with steps 21 and 22 in that T-line models could be defined as each critical interconnect, whether or not affected by a crossing line, is identified. In any case, when the T-line models have been constructed, with environment terminals where appropriate, for all critical interconnects, the schematic design can be constructed from the high level design as indicated by step 24 of the design flow. Here, the various circuit components such as transistors, resistors, connecting wires etc. may be defined, with the T-line models being treated as any other circuit components at this stage. Thus, the T-line models are included in the schematic design, and environment terminals (where provided) connected to the appropriate crossing lines in the design. Preliminary simulation is typically performed by simulation tool 15 at this stage based on the entire net-list, including T-line models, and various adjustments may be made. For example, T-line model parameters may be refined as appropriate, and additional critical interconnects, or critical interconnects affected by crossing lines, may be identified at this stage. Thus, additional environment terminals may be included in the design at this stage, and step 24 may refer back to step 23 as indicated in the figure to allow additional T-line models to be defined and included in the schematic design.

In the next stage of the design flow, the physical, layout design is defined as indicated by step 25 of FIG. 3. The physical design incorporates the circuit components and parameters of the schematic design, with further adjustment if appropriate, and indicates the physical locations of these components. As described earlier, the T-line models are passed into the layout design as parameterized cells, and where adjustments are made, e.g. to the lengths of T-lines, the model parameters may be refined as appropriate. Thus, step 25 also refers back to step 23 in this embodiment to allow modification of T-line models where required. Also, additional environment terminals may be added at this stage as the geometry of crossing lines is clarified, and the values of capacitors in environment terminals may be modified where appropriate.

Once the physical design is complete, the design flow proceeds to step 26 which represents the post-layout extraction stage. This is performed generally as described above for our earlier design system, whereby component parameters are extracted from the layout design for simulation purposes, with wires modeled as T-lines being recognized and treated as any other library elements. Interconnects not modeled as T-lines at this extraction stage receive the limited, though faster, treatment provided by conventional design systems, whereby the extraction tool performs an approximate calculation for wire non-ideal properties. In addition to these basic operations, the extraction tool also provides the final post-layout environment information for T-lines and can therefore recalculate the individual capacitance values of FIG. 6 based on this final T-line environment information. Capacitance values in existing environment terminals may be modified, connections to crossing lines may be adjusted, and new environment terminals may be added where required to more accurately reflect cross-talk effects during simulation. In this way, the extraction tool ensures that appropriate environment terminals are connected to crossing lines in the design in a way that best represents their mutual relations. Next, in step 27 of the design flow, simulation tool 15 performs a simulation of the design based on the component parameters extracted in extraction step 26. Thus, the complete net-list, including both T-line models and other layout-extracted components, is simulated for comparison with the original design requirements for the IC. If discrepancies are found here, the process may revert to an earlier design stage (in this embodiment schematic design step 24 as indicated in the figure) to allow appropriate adjustments to be made. However, the features described above for dealing with critical interconnects at various stages of the design flow offer a high probability that a single iteration of the process will provide a successful design.

It will be seen that the foregoing embodiment provides an interconnect-aware IC design process in which crossing-line effects can be incorporated at various stages of the process, leading to a highly efficient IC design process. During the early design phase, environment terminals can be used for simulation of the capacitive load induced by crossing lines. As the design process advances and the geometry of crossing lines becomes clearer, capacitor values in environment terminals can be adjusted to more accurately reflect cross-talk effects. Finally, when most circuit details are available, environment terminals can be added and/or modified as required to best represent the effects of crossing lines in the design. The restrictions imposed by the closed environment concept in our earlier interconnect-aware design process are thus partially relaxed to accommodate effects of crossing lines on T-line paths, while retaining the main idea and benefits of the earlier concept. The resulting methodology allows efficient treatment of a wide range of high speed design applications, including high density applications such as CMOS designs.

While a particularly preferred embodiment has been detailed above, it will be appreciated that many changes and modifications can be made to the embodiment described without departing from the scope of the invention. For example, while the design process commences with a preliminary design in the form of a high level design in the foregoing embodiment, the preliminary design may take other forms. As an example, in certain lower-scale AMS designs the design process is sometimes more loose. The high level design stage may be lacking, done informally or not implemented by the CAD system. Here, a designer may effectively start from the schematic design stage by designing smaller blocks of the overall design, with the identification of critical interconnects starting at this stage. The collection of smaller blocks may then be integrated at a later stage, where further critical interconnects may be identified, to form the complete design. Here, therefore, the collection of smaller blocks effectively form the preliminary design with which the design process commences. As a further example, while environment terminals include a capacitor in the above embodiment to represent the effect of crossing lines, environment terminals could incorporate other components if desired. At present, designs which incorporate crossing lines generally only allow perpendicular crossing lines, in which case a capacitive coupling is sufficient to capture the crossing line effect. However, operation of the system is not limited to perpendicular crossing lines, and the system may allow a designer freedom to incorporate other components to represent other effects, e.g. where crossing lines at other angles are accommodated in the design. However, even where non-perpendicular crossing lines are provided, it may be more desirable to approximate by considering only capacitive effects to avoid the complexity resulting from incorporating inductive effects. As a further example, different types of crossing lines, such as buses and power grids, may be treated differently in some embodiments, with different environment terminals being used for each. In addition, while a predefined set of T-line structures is provided in the above embodiment, allowing simple selection of an appropriate structure, T-line structures could be defined by a designer in other embodiments. Also, embodiments might be envisaged where T-line models are defined by selection from a predefined set of models, with variable component parameters, where the selection and parameter specification could be performed by the designer or could be wholly or partly automated. It will be apparent to those skilled in the art that many other changes and modifications can be made to the foregoing embodiments within the spirit and scope of the present invention.

We claim:

1. A method for designing an integrated circuit, the method comprising the steps of:
   defining a preliminary design of the integrated circuit;
   identifying critical interconnect lines in the preliminary design;
   identifying any critical interconnect lines affected by crossing lines in the preliminary design;
   defining a transmission line model to represent each critical interconnect line;
   defining a layout design of the integrated circuit, comprising circuit components and parameters thereof, using said preliminary design and said transmission line model for each critical interconnect line; and
   extracting circuit component parameters from the layout design for simulation of the design using the extracted circuit component parameters;
   wherein for each transmission line model representing a critical interconnect line affected by a crossing line, the method includes providing an environment terminal, comprising a connection to the model via at least one circuit component representing the effect of the crossing line on the model, and connecting the environment terminal to the crossing line in the integrated circuit design.

2. A method according to claim 1 wherein the preliminary design comprises a high level design of the integrated circuit.

3. A method according to claim 1 wherein said at least one circuit component representing the effect of the crossing line comprises a capacitor.

4. A method according to claim 1 wherein the critical interconnect line comprising: at least a subset of critical interconnect lines affected by crossing lines, the step of defining a transmission line model to represent each critical interconnect line in the subset includes providing said environment terminal for that transmission line model.

5. A method according to claim 1 wherein " the critical interconnect line comprising: ". at least a subset of critical interconnect lines affected by crossing lines, the step of defining a layout design includes providing said environment terminal for the transmission line model representing each critical interconnect line in the subset.

6. A method according to claim 1 wherein the critical interconnect line comprising: at least a subset of critical interconnect lines affected by crossing lines, the step of extracting circuit component parameters includes providing said environment terminal for the transmission line model representing each critical interconnect line in the subset.

7. A method according to claim 2 wherein the step of defining a layout design comprises:
  defining a schematic design of the integrated circuit, comprising a preliminary set of circuit components and parameters thereof, using said high level design and said transmission line model for each critical interconnect line; and
  defining the layout design, comprising a secondary set of circuit components and parameters thereof and indicating component locations, using said schematic design.

8. A method according to claim 1 wherein the transmission line model defined for each critical interconnect line comprises an RLC network.

9. A method according to claim 1 wherein the step of defining a transmission line model comprises:
  defining a transmission line structure;
  defining geometrical parameters for the transmission line structure; and
  defining the transmission line model in dependence on said structure and geometrical parameters.

10. A method according to claim 9 wherein the step of defining a transmission line structure comprises selecting the structure from a predefined set of transmission line structures.

11. A method according to claim 1 including the step of simulating the design using said extracted circuit component parameters.

12. An integrated circuit design system comprising:
  means for defining a preliminary design of an integrated circuit;
  means for defining transmission line models to represent respective critical interconnect lines in the preliminary design;
  means for defining a layout design of the integrated circuit, comprising circuit components and parameters thereof, based on said preliminary design and said transmission line model for each critical interconnect line;
  post-layout extraction means for extracting circuit component parameters from the layout design for simulation of the design using the extracted circuit component parameters; and
  means for including in the integrated circuit design, for each transmission line model representing a critical interconnect line affected by a crossing line in the design, an environment terminal connected to said crossing line, the environment terminal comprising a connection to said model via at least one circuit component representing the effect of said crossing line on the model.

13. A system according to claim 12 wherein the preliminary design comprises a high level design of the integrated circuit.

14. A system according to claim 12 wherein said at least one circuit component representing the effect of the crossing line comprises a capacitor.

15. A system according to claim 12 wherein said means for defining transmission line models is adapted for providing a said environment terminal for a transmission line model representing a critical interconnect line affected by a crossing line in the preliminary design.

16. A system according to claim 12 wherein said means for including an environment terminal in the design comprises said post-layout extraction means.

17. A system according to claim 12 wherein each transmission line comprises an RLC network.

18. A system according to claim 12 wherein said means for defining a transmission line model includes means for defining a transmission line structure and geometrical parameters thereof, and for defining the transmission line model in dependence on said structure and geometrical parameters.

19. A system according to claim 18 wherein said means for defining a transmission line structure comprises means for selecting the structure from a predefined set of transmission line structures.

20. A system according to claim 12 including means for simulating the design using said extracted circuit component parameters.

21. A computer program product comprising a computer-readable medium having embodied therein computer-readable program code means for causing a computer to implement an integrated circuit design system comprising:
  means for defining a preliminary design of an integrated circuit;
  means for defining transmission line models to represent respective critical interconnect lines in the preliminary design;
  means for defining a layout design of the integrated circuit, comprising circuit components and parameters thereof, based on said preliminary design and said transmission line model for each critical interconnect line;
  post-layout extraction means for extracting circuit component parameters from the layout design for simulation of the design using the extracted circuit component parameters; and
  means for including in the integrated circuit design, for each transmission line model representing a critical interconnect line affected by a crossing line in the design, an environment terminal connected to said crossing line, the environment terminal comprising a connection to said model via at least one circuit component representing the effect of said crossing line on the model.

* * * * *